United States Patent [19]
Hembree et al.

[11] Patent Number: 5,915,977
[45] Date of Patent: Jun. 29, 1999

[54] SYSTEM AND INTERCONNECT FOR MAKING TEMPORARY ELECTRICAL CONNECTIONS WITH BUMPED SEMICONDUCTOR COMPONENTS

[75] Inventors: David R. Hembree; John O. Jacobson; James M. Wark, all of Boise; Warren M. Farnworth, Nampa; Salman Akram; Alan G. Wood, both of Boise, all of Id.

[73] Assignee: Micron Technology, Inc., Boise, Id.

[21] Appl. No.: 09/138,612

[22] Filed: Aug. 24, 1998

Related U.S. Application Data

[62] Division of application No. 08/867,551, Jun. 2, 1997.
[51] Int. Cl.⁶ .................................................. H01R 9/09
[52] U.S. Cl. .................................................. 439/74
[58] Field of Search ............................. 439/74, 70, 71, 439/66, 81

[56] References Cited

U.S. PATENT DOCUMENTS

| | | | |
|---|---|---|---|
| 4,937,653 | 6/1990 | Blonder | 357/68 |
| 4,969,828 | 11/1990 | Bright et al. | 439/68 |
| 5,006,792 | 4/1991 | Malhi et al. | 324/158 F |
| 5,072,289 | 12/1991 | Sugimoto et al. | 357/68 |
| 5,088,190 | 2/1992 | Malhi et al. | 29/843 |
| 5,172,050 | 12/1992 | Swapp | 324/158 P |
| 5,206,585 | 4/1993 | Chang et al. | 324/158 P |
| 5,289,631 | 3/1994 | Koopman et al. | 29/840 |
| 5,326,428 | 7/1994 | Farnworth et al. | 156/654 |
| 5,329,423 | 7/1994 | Scholz | 361/760 |
| 5,408,190 | 4/1995 | Wood et al. | 324/765 |
| 5,414,372 | 5/1995 | Levy | 324/765 |
| 5,420,520 | 5/1995 | Anschel et al. | 324/754 |
| 5,440,240 | 8/1995 | Wood et al. | 324/765 |
| 5,451,165 | 9/1995 | Cearley-Cabbiness | 439/71 |
| 5,453,701 | 9/1995 | Jensen et al. | 324/755 |

(List continued on next page.)

OTHER PUBLICATIONS

Mul, Gary K. et al., Design Optimization for C4 Bare Die Burn–in and Test Carrier/Socket Assembly (with Statistical Considerations), *The International Journal of Microcircuits and Electronic Packaging*, vol. 19, No. 2, 2nd Qtr 1996, pp. 128–137.

Miyake, K., et al, "Connectivity Analysis of New "Known Good Die" Connection System Using Microbumps", Proceedings of IMC, pp. 156–161, 1994.

EIAJ/Area Array Subcommittee/Memory CSP WG, JWG#2–8, San Diego, advertising brochure, Jun., 1995.

"Science Over Art. Our New IC Membrane Test Probe", Packard Hughes Interconnect, advertising brochure, 1993.

"Cobra™ technology, makes Wentworth Labs the world's most advanced probe card manufacturer,", Wentworth Laboratories, 1996.

Foo, See–Hack and Prokopchak, Lina., "Known Good Die: A Commerical Solution for Burn–In and Test Before Packaging", Aehr Test Systems, presented at Semicon Japan, Dec. 1994.

*Primary Examiner*—Neil Abrams
*Assistant Examiner*—T C Patel
*Attorney, Agent, or Firm*—Stephen A. Gratton

[57] ABSTRACT

An interconnect and system for establishing temporary electrical communication with semiconductor components having contact bumps are provided. The interconnect includes a substrate with patterns of contact members adapted to electrically contact the contact bumps. The substrate can be formed of a material such as ceramic, silicon, FR-4, or photo-chemically machineable glass. The contact members can be formed as recesses covered with conductive layers in electrical communication with conductors and terminal contacts on the substrate. Alternately, the contact members can be formed as projections adapted to penetrate the contact bumps, as microbumps with a rough textured surface, or as a deposited layer formed with recesses. The interconnect can be employed in a wafer level test system for testing dice contained on a wafer, or in a die level test system for testing bare bumped dice or bumped chip scale packages.

24 Claims, 5 Drawing Sheets

U.S. PATENT DOCUMENTS

| | | | |
|---|---|---|---|
| 5,477,160 | 12/1995 | Love | 324/755 |
| 5,481,205 | 1/1996 | Frye et al. | 324/757 |
| 5,483,741 | 1/1996 | Akram et al. | 29/846 |
| 5,487,999 | 1/1996 | Farnworth | 437/7 |
| 5,495,179 | 2/1996 | Wood et al. | 324/755 |
| 5,500,605 | 3/1996 | Chang | 439/70 |
| 5,517,125 | 5/1996 | Posedel et al. | 324/755 |
| 5,519,332 | 5/1996 | Wood et al. | 324/755 |
| 5,523,696 | 6/1996 | Charlton et al. | 324/758 |
| 5,530,376 | 6/1996 | Lim et al. | 324/765 |
| 5,534,785 | 7/1996 | Yoshizaki et al. | 324/758 |
| 5,541,525 | 7/1996 | Wood et al. | 324/755 |
| 5,543,725 | 8/1996 | Lim et al. | 324/755 |
| 5,581,195 | 12/1996 | Lee et al. | 324/755 |
| 5,592,736 | 1/1997 | Akram et al. | 29/842 |
| 5,607,818 | 3/1997 | Akram et al. | 430/311 |
| 5,625,298 | 4/1997 | Hirano et al. | 324/754 |
| 5,691,041 | 11/1997 | Frankeny et al. | 428/209 |
| 5,716,218 | 2/1998 | Farnworth et al. | 438/15 |
| 5,783,461 | 7/1998 | Hembree | 438/17 |
| 5,789,271 | 8/1998 | Akram | 438/18 |
| 5,808,360 | 9/1998 | Akram | 257/38 |
| 5,815,000 | 9/1998 | Farnworth et al. | 324/755 |
| 5,834,366 | 11/1998 | Akram | 438/614 |
| 5,869,974 | 2/1999 | Akram et al. | 324/754 |

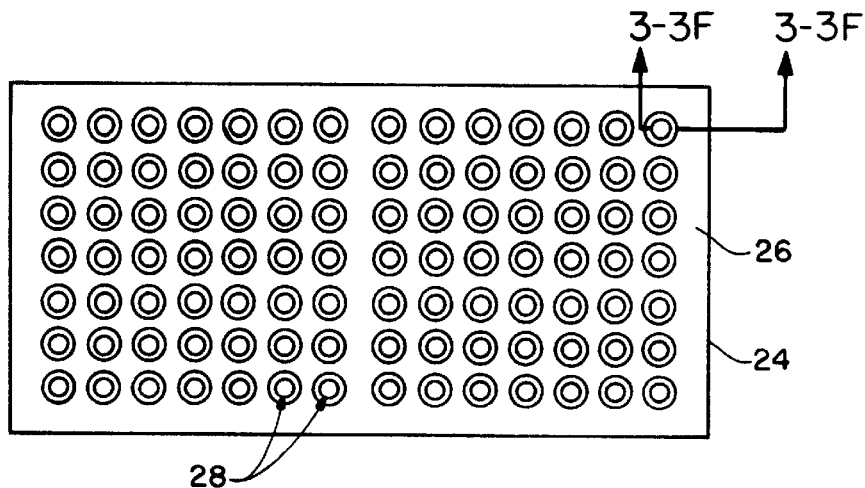
FIGURE 2
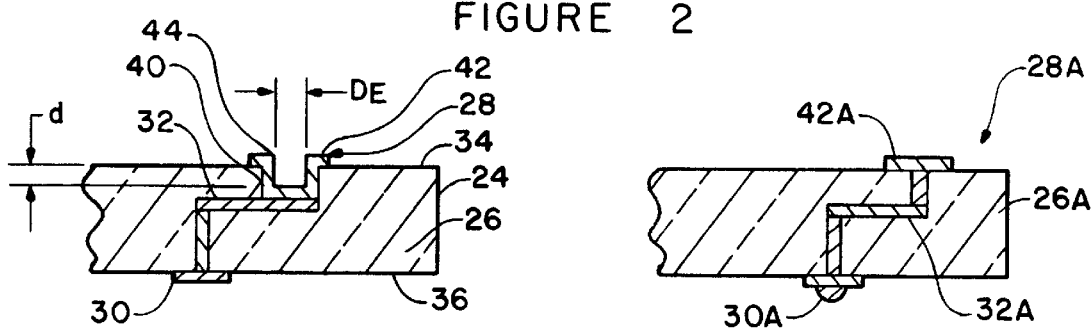
FIGURE 3
FIGURE 3A
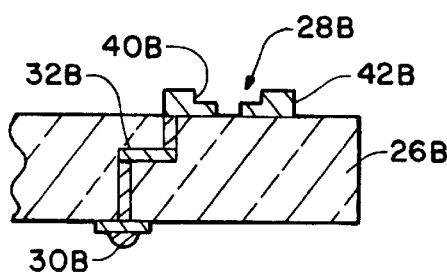
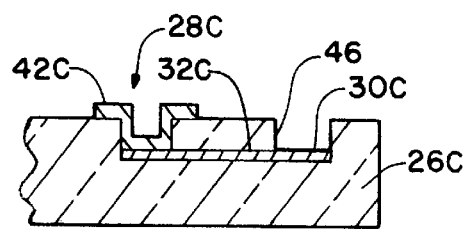
FIGURE 3B
FIGURE 3C
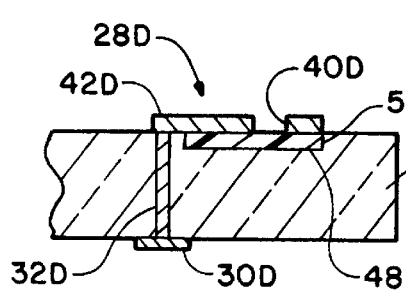
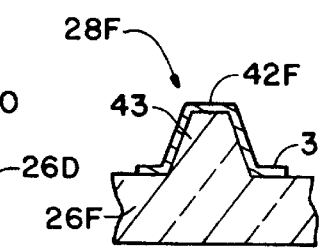
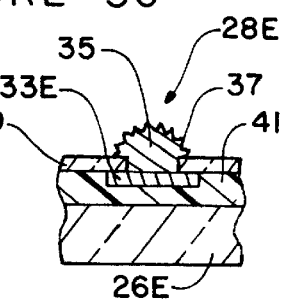
FIGURE 3D
FIGURE 3F
FIGURE 3E

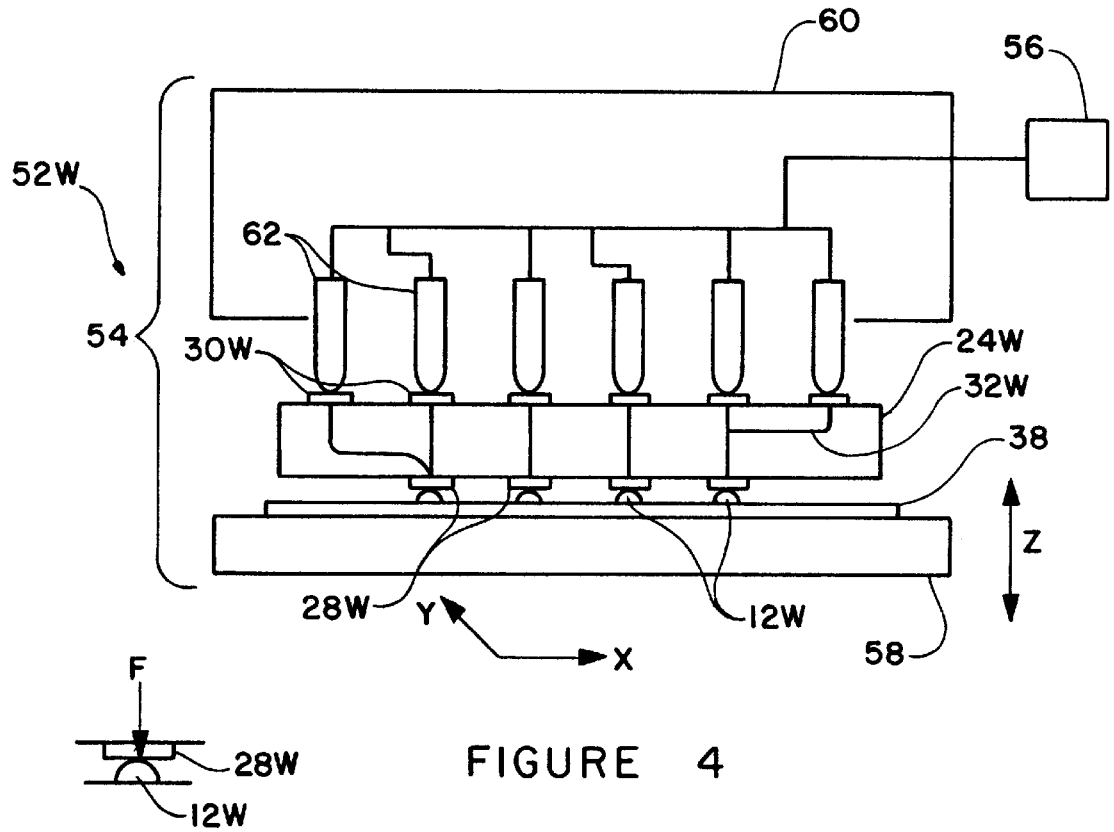
FIGURE 4
FIGURE 4B
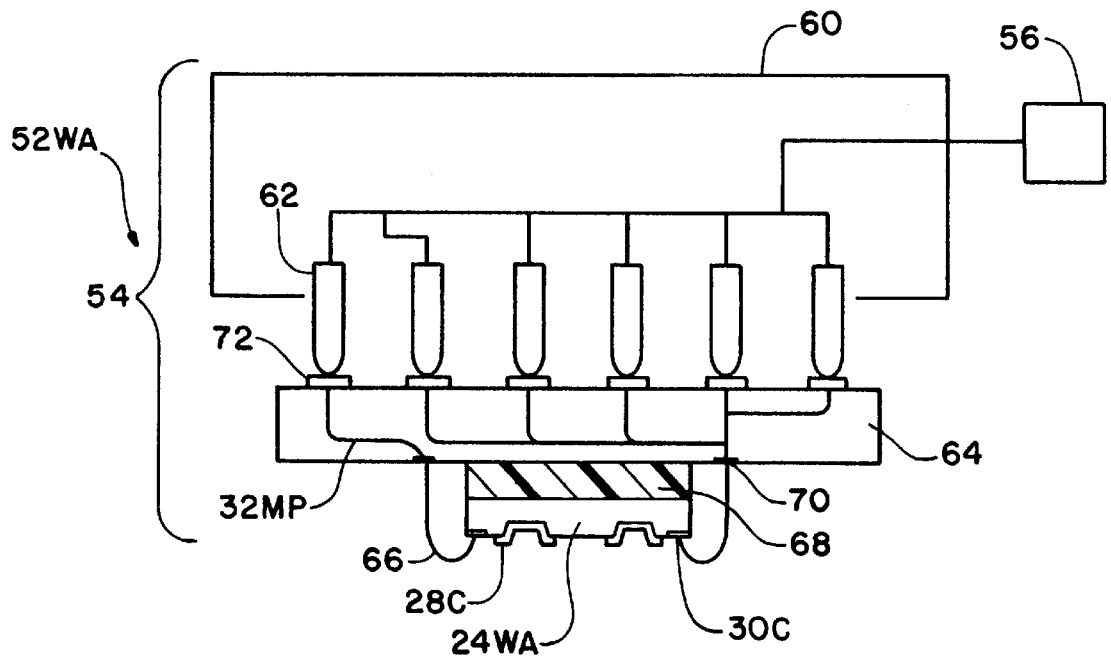
FIGURE 4A

SYSTEM AND INTERCONNECT FOR MAKING TEMPORARY ELECTRICAL CONNECTIONS WITH BUMPED SEMICONDUCTOR COMPONENTS

CROSS REFERENCE TO RELATED APPLICATIONS

This application is a division of application Ser. No. 08/867,551, filed on Jun. 2, 1997.

FIELD OF THE INVENTION

This invention relates generally to semiconductor manufacture, and more particularly to an improved interconnect for making temporary electrical connections with bumped semiconductor components such as wafers, dice and packages having contact bumps. Also provided are improved test systems and test methods that utilize the interconnect and methods for fabricating the interconnect.

BACKGROUND OF THE INVENTION

Various semiconductor components include contact bumps that provide connection points between the integrated circuits included in the component and the outside world. For example, bumped semiconductor wafers can include patterns of contact bumps. Singulated unpackaged dice, such as known good die (KGD), can also include contact bumps which permit the dice to be flip chip mounted in multi chip modules and other electronic systems. Other semiconductor components, such as packaged dice and chip scale packages, can also include contact bumps.

Typically, lead tin alloys (e.g., 95/5 lead tin alloy) and a ball limiting metallurgy (BLM) process are used to form the contact bumps. With this process the contact bumps are dome shaped, and have an average diameter of from 5 mils to 30 mils. The sides of the bumps typically bow or curve outwardly from flat top surfaces. The flat top surfaces of the bumps form the actual areas of contact with contacts on a mating electrical component (e.g., circuit board). In addition, the contact bumps can be formed on the component in a dense array such as a ball grid array (BGA). Micro ball grid arrays are formed in the smaller range, while standard ball grid arrays are formed in the larger size range.

With bumped semiconductor components, it is sometimes necessary to make non-bonded, or temporary, electrical connections with the contact bumps. For example, contact bumps can be used for probe testing of semiconductor wafers, or for burn-in testing bumped dice and packages. For testing unpackaged dice and chip scale packages, temporary packages can be used to house the dice or packages during the testing procedure.

In the past, following testing of semiconductor components having contact bumps, it has been necessary to reflow the bumps, which are typically damaged by the test procedure. This is an additional process step which adds to the expense and complexity of the testing process. Furthermore, the reflow process requires heating the tested components which can adversely affect the integrated circuitry contained in the component.

Another problem with making temporary electrical connection with contact bumps is that the sizes of the contact bumps can vary between different components, or within the same component. For example, typical contact bumps for a particular type of component can have diameters between 4.5 mils to 5.5 mils. In addition, the x-y location, and the planarity (i.e., z-direction location), of the contact bumps can also vary. These dimensional variations can cause misalignment making reliable temporary electrical connections difficult to form with the contact bumps.

Because of the increasing use of contact bumps in semiconductor manufacture, improved interconnects are needed for making temporary electrical connections to the contact bumps.

SUMMARY OF THE INVENTION

In accordance with he present invention, an improved interconnect for making temporary electrical connections with bumped semiconductor components is provided. The interconnect can be configured for use with semiconductor wafers, singulated semiconductor dice, or semiconductor packages. The interconnect is particularly suited for use in fabricating testing systems, and in performing testing procedures for bumped components.

The interconnect, generally stated, comprises: a substrate; contact members formed on the substrate for electrically contacting contact bumps on a semiconductor component; terminal contacts formed on the substrate for electrical connection to external electrical connectors of a testing apparatus; and conductors formed on the substrate for providing conductive paths between the contact members and terminal contacts.

The substrate can be formed of ceramic, silicon, FR-4, mullite, photosensitive glass, or photosensitive ceramic material. The contact members can be formed as recesses in the substrate covered with a conductive layer; as flat pads formed of a conductive material; as a conductive layer deposited on the substrate and etched with a recess; as raised projections etched into the substrate and covered with a conductive layer; or as textured microbumps on a multi layered tape similar to TAB tape.

In each contact member embodiment the conductive layers can be formed of a material that is non-reactive with the contact bumps. The contact members can also include a compliant layer for cushioning the contact forces applied by a testing apparatus to the interconnect. The terminal contacts can be formed as flat pads in a land grid array, as balls in a ball grid array, or as pins in a pin grid array. The conductors can comprise metal containing vias in the substrate or patterned metal layers on the substrate.

The interconnect can be included in a wafer level test system, or a die level test system. In the wafer level test system, the interconnect can be mounted to a probe card fixture of a conventional testing apparatus, such as a wafer handler. During a test procedure, test circuitry associated with the testing apparatus can apply test signals through the interconnect to the integrated circuits on the wafer. In addition, the test signals can be electronically switched as required, to selected dice on the wafer. In the die level test system, the interconnect can be mounted to a temporary package configured to house a single bare die or a chip scale package. The temporary package can be mounted to a testing apparatus such as a test socket or burn-in board configured to apply test signals through the interconnect to the die.

BRIEF DESCRIPTION OF THE DRAWINGS

FIG. 2 is an enlarged schematic plan view of an interconnect constructed in accordance with the invention;

FIG. 3 is a cross sectional view taken along section line 3—3 of FIG. 2 illustrate a substrate, contact members, internal conductors and terminal contacts of the interconnect;

FIG. 3A is a cross sectional view equivalent to FIG. 3 of an alternate embodiment interconnect having flat contact members and terminal contacts in a ball grid array;

FIG. 3B is a cross sectional view equivalent to FIG. 3 of an alternate embodiment interconnect having a deposited contact member and terminal contacts in a pin grid array;

FIG. 3C is a cross sectional view equivalent to FIG. 3 of an alternate embodiment interconnect having co-planar contact members and terminal contacts;

FIG. 3D is a cross sectional view equivalent to FIG. 3 of an alternate embodiment interconnect having a contact member with a compliant member formed integrally with a substrate of the interconnect;

FIG. 3E is a cross sectional view equivalent to FIG. 3 of an alternate embodiment interconnect including microbump contact members having a rough textured surface adapted to penetrate an oxide layer covering a contact bump;

FIG. 3F is a cross sectional view equivalent to FIG. 3 of an alternate embodiment interconnect including a raised contact member adapted to penetrate a contact bump;

FIGS. 4 and 4A are schematic side elevational view of systems for testing semiconductor wafers using interconnects constructed in accordance with the invention;

FIG. 4B is a schematic view illustrating a contact force between the contact members on the interconnect and the contact bumps on the wafer;

DETAILED DESCRIPTION OF THE PREFERRED EMBODIMENTS

Figure 1A:
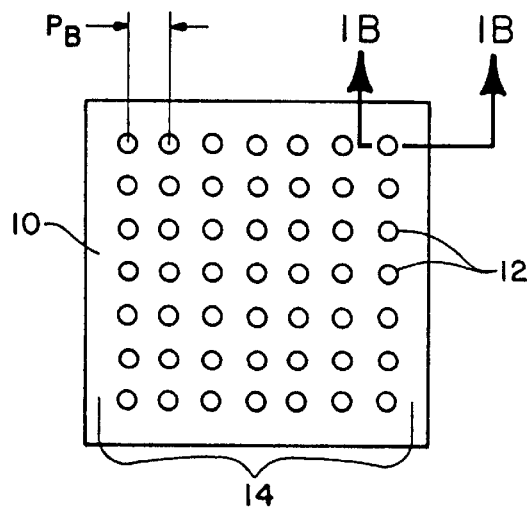
FIG. 1A is a plan view of a bumped semiconductor die including contact bumps arranged in a ball grid array (BGA)
Figure 1B:
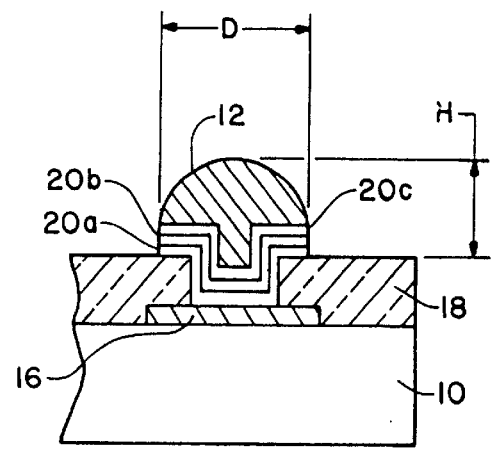
FIG. 1B is an enlarged cross sectional view of a contact bump taken along section line 1B—1B of FIG. 1A.

Referring to FIGS. 1A and 1B, a bumped semiconductor die 10 is shown. The die 10 includes a pattern of contact bumps 12 arranged in a ball grid array (BGA) 14. As shown in FIG. 1B, the die 10 also includes a passivation layer 18 and contacts 16 for the bumps 12. The contacts 16 are in electrical communication with the semiconductor devices and integrated circuits formed on the die 10.

Each bump 12 can be formed on a corresponding contact 16. In addition, each bump 12 can include a stack of underlying layers 20a–c. By way of example, layer 20a can be an adherence layer (e.g., Cr), layer 20b can be a solderable layer (e.g., Cu) and layer 20c can be a flash layer (e.g., Au). The bumps 12 can be formed by processes that are known in the art such as ball limiting metallurgy (BLM). Typically the bumps 12 are formed of a lead/tin solder (e.g., 95 Pb/5 Sn).

As shown in FIG. 1B, each bump 12 can be generally hemispherical, convex, or dome-shaped, with an outside diameter "D" and a height of "H". In general, the diameter "D" of the bumps 12 will be different for different bumps. Also the height "H" will be different causing non-planarity of the ball grid array 14 (FIG. 1A) in the z-direction. Still further, the pitch "PB" (FIG. 1A) and location of the bumps 12 can vary. These dimensional variations will occur between the bumps on the same die and between the bumps on different dice, particularly different types of dice.

Figure 1C:
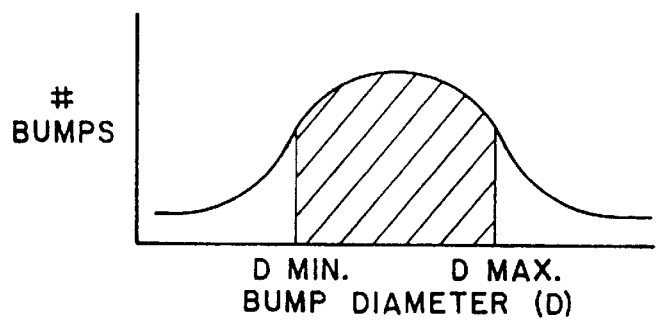
FIG. 1C is a graph illustrating a sampling of bumped semiconductor dice wherein an average minimum bump diameter ($D_{MIN}$) and an average maximum bump diameter ($D_{MAX}$) are ascertained.

As shown in FIG. 1C, measurement and statistical analysis techniques can be used to ascertain a range of bump diameters "D" for a particular type of die. FIG. 1C shows simple analysis wherein an average minimum bump diameter ($D_{MIN}$) and an average maximum bump diameter ($D_{MAX}$) are ascertained. A similar analysis can be performed to ascertain an average minimum height ($H_{MIN}$) and an average maximum height ($H_{MAX}$). By determining a statistical average size range for the bumps, an interconnect can be constructed in accordance with the invention to accommodate a range of bumps sizes.

By way of example, a standard micro ball grid array (BGA) can include bumps having an average minimum bump diameter ($D_{MIN}$) of about 4.5 mils and an average maximum bump diameter ($D_{MAX}$) of about 5.5 mils. An average bump diameter ($D_{AVG}$) can be about 5.0 mils. An average minimum height ($H_{MIN}$) can be about 2.8 mils and an average maximum height ($H_{MAX}$) about 4.2 mils. An average height ($H_{AVG}$) can be about 3.7 mils.

Figure 1D:
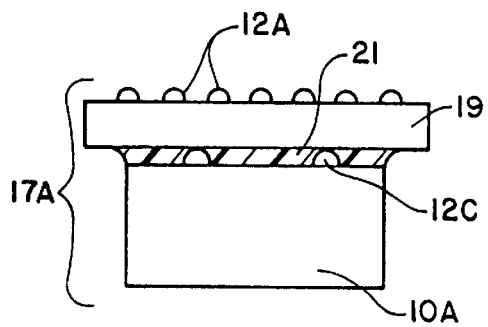
FIG. 1D is a schematic cross sectional view of a chip scale package having contact bumps.
Figure 1E:
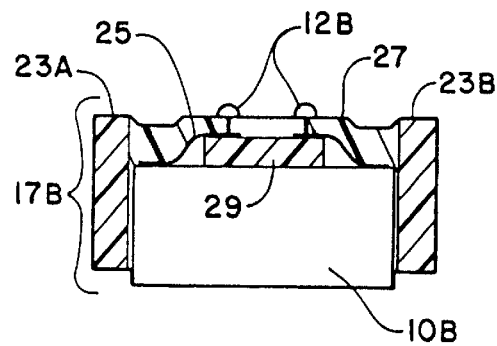
FIG. 1E is a schematic cross sectional view of another chip scale package having contact bumps.

Referring to FIGS. 1D and 1E, a die can also be contained within a chip scale package 17A (FIG. 1D) or a chip scale package 17B (FIG. 1E). In FIG. 1D, the chip scale package 17A comprises a semiconductor die 10A, and a BGA substrate 19 bonded to the face of the die 10A using an adhesive layer 21. The BGA substrate 19 includes bumps 12A in electrical communication with bumps 12C on the die 10A. The bumps 12A on the BGA substrate 19 are substantially equivalent to the bumps 12 (FIG. 1B) previously described.

In FIG. 1E, the chip scale package 17B includes a semiconductor die 10B, and protective members 23A, 23B bonded to either side of the die 10B. In addition, the chip scale package 17B includes bumps 12B in electrical communication with the die bond pads via leads 25. An encapsulant 27 and an elastomeric pad 29 electrically isolate the leads 25 and bumps 12B. As is apparent these configurations are merely exemplary and other chip scale package configurations are common in the art.

Referring to FIG. 2 and 3, an interconnect 24 constructed in accordance with the invention is shown. The interconnect 24 includes a substrate 26; patterns of contact members 28 formed on the substrate 26; patterns of terminal contacts 30 (FIG. 3) in electrical communication with the contact members 28; and internal conductors 32 (FIG. 3) electrically connecting the contact members 28 to the terminal contacts 30.

The substrate 26 is preferably formed of an electrically insulating material. Preferred materials include ceramic, FR-4, mullite, photosensitive glass and photosensitive ceramic. However, the substrate can also be formed of an electrically conductive material such as silicon provided electrically insulating Layers are employed.

In the illustrative embodiment the substrate 26 comprises a plate having a first planar surface 34 (FIG. 3) wherein the contact members 28 are formed, and a second opposing planar surface 36 wherein the terminal contacts 30 are formed. A size and peripheral outline of the substrate 26 can be selected as required. For a die level test system, the substrate 26 can have a size and outline corresponding to the size and outline of semiconductor die 10 (FIG. 1A) For a wafer level test system, the substrate 26 can have a size and outline corresponding to the size and outline of a semiconductor wafer 38 (FIG. 4) or portion thereof.

The contact members 28 are configured to establish electrical communication with corresponding patterns of contact bumps, such as bumps 12 (FIG. 1B) on the bumped die 10, bumps 12A (FIG. 1D) on chip scale package 17A, bumps 12B (FIG. 1E) on chip scale package 17B, or bumps 12W (FIG. 4) on a semiconductor wafer 38 (FIG. 4). In FIG. 2, the contact members 28 are formed in a dense grid pattern. However, it is to be understood that the patterns of contact members 28 on the interconnect 24 will correspond to the patterns of the bumps 12, 12A, 12B, 12W on the device under test. Thus if the bumps 12, 12A, 12B, 12W are arranged in a dense array such as a ball grid array, the contact members 28 can be arranged in a corresponding array. Further details of the contact members 28 will become more apparent as the description proceeds.

In the embodiment illustrated in FIG. 3, each contact member 28 comprises a recess 40 formed in the substrate 26, and a conductive layer 42 at least partially covering the recess 40. The conductive layer 42 for each contact member 28 is in electrical communication with an associated internal conductor 32 formed within the substrate 26 and an associated terminal contact 30. The recess 40 for each contact member 28 can be etched, laser drilled, photochemically machined or otherwise formed in the substrate 26. In addition, the recess 40 can be formed with a selected depth and a selected size and shape (e.g., circular, square, rectangular, elongated rectangular, circular or oval shaped).

The contact members 28 can also include a peripheral edge 44 configured to penetrate the contact bumps 12, 12A, 12B, 12W and break through native oxide layers. The peripheral edge 44 can be formed by the rim of the conductive layer 42 as the conductive layer 42 follows the contour of the recess 40. The recesses 40 and peripheral edges 44 can be sized and shaped to compensate for variations in the diameter (D), height (H), volume (V), shape, and planarity of the bumps 12, 12A, 12B, 12W. In particular, a diameter "$D_E$" of the peripheral edges 44 and depth "d" of the recesses 40 can be selected such that bumps 12, 12A, 12B, 12W with an average minimum bump diameter ($D_{MIN}$) can be electrically contacted. At the same time, bumps 12, 12A, 12B, 12W having an average maximum bump diameter ($D_{MAX}$) can also be electrically contacted by the peripheral edges 44 of the conductive layers 42 but with a minimal amount of bump deformation.

Figure 6A:
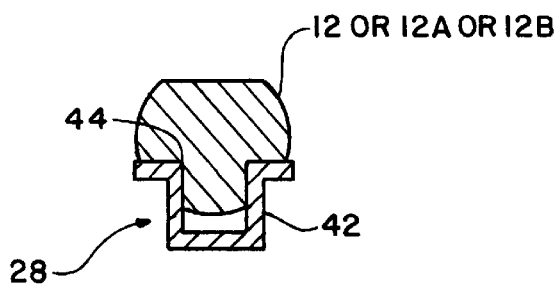
FIG. 6A is a schematic cross sectional view illustrating the contact member of FIG. 3 in electrical contact with a contact bump on a bumped semiconductor component.
Figure 6B:
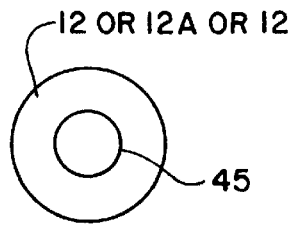
FIG. 6B is a schematic bottom view of the contact bump in FIG. 6A following contact by the contact member of FIG. 3.

FIG. 6A illustrates the contact bump 12, 12A, 12B, 12W in electrical communication with the conductive layer 42. In general the contact bumps 12, 12A, 12B, 12W are pressed into the contact member 28 and deformed by the conductive layer 42. Additionally, as shown in FIG. 6B a peripheral groove 45 is formed in each bump 12, 12A, 12B, 12W by the edges 44 of the conductive layer 12. The peripheral groove 45 extends into the interior of the contact bump 12, 12A, 12B, 12W so that the edge 44 directly contacts metal rather than native oxide.

The conductive layers 42 can be formed of a metal using a suitable metallization process (e.g., deposition, photopatterning, etching) or a suitable plating process (e.g., electrolytic or electroless plating). In addition, the conductive layers 42 can be formed as multi-layered stacks of metals. For example an inner layer can be a bonding layer and an outer layer can be a non-reactive barrier layer.

Preferably, the conductive layers 42 are formed of a material that is non-reactive with the bumps 12, 12A, 12B, 12W. For bumps 12, 12A, 12B, 12W formed of solder, suitable materials for the conductive layers 42 include Be, Mg, Ca, Sr, Ba, Sc, Y, La, Ti, Zr, Hf, V, Nb, Ta, Mo, W, Tc, Re, B, C, Si, Ge and alloys of these materials.

Some of these materials, such as the metals, can be easily plated or metallized in suitable patterns. An exemplary metallization process is disclosed in U.S. Pat. No. 5,607,818, incorporated herein by reference. Other of the above materials can be deposited as alloys or in combination with other elements. For example, the conductive layers 42 can comprise a metal silicide such as $TiSi_2$, $WSi_2$, $TaSi_2$, $MoSi_2$, $PtSi_2$. In this case, a silicon containing layer and a metal layer can be deposited and then reacted to form a metal silicide. An exemplary metal silicide deposition process is disclosed in U.S. Pat. No. 5,483,741, incorporated herein by reference. Still further, other alloys such as TiN, TiW, TiC and NiB can be deposited using CVD or other deposition process.

As shown in FIG. 3, the conductive layers 42 are in electrical communication with the internal conductors 32. The formation of the internal conductors 32 is dependent on the material for the substrate 26. With the substrate 26 comprising ceramic, a high temperature ceramic lamination process can be used to form a multi layered substrate 26 with internal conductors 32. Briefly, such a process can be performed using green sheets of unsintered flexible raw ceramic. The green sheets can be cut to size, and features such as the recesses 40 for the contact members 28 can be formed. In addition, via holes can be formed in the z-direction, and either filled or coated with a conductive material (e.g., tungsten paste), to provide an interlevel connection between the different layers in the substrate 26. Next, a screen printing process can used to print a metallized pattern of horizontal conductive lines on selected green sheet surfaces. The horizontal conductive lines can be formed of a refractory metal such as tungsten or other suitable metal. Several green sheets, formed as required, can then be stacked in the required sequence and bonded together. The different green sheets can then be sintered at elevated temperature (1500° C.–1600° C.) in a reducing atmosphere.

Following the sintering process, the contact members 28 can be formed as previously described. A suitable deposition process, such as plating, can then be used to form the terminal contacts 30 out of a suitable metal (e.g., gold with nickel underplating). In the embodiment illustrated in FIG. 3, the terminal contacts 30 comprise flat land pads arranged in a land grid array. As will be further explained these flat terminal contacts 30 can be electrically contacted by electrical connectors such as spring loaded pins. The plating process can include electrolytic or electroless deposition followed by resist coating, exposure, development, and selective wet chemical etching. Next, cutting or punching operations can be performed to define the peripheral dimensions of the interconnect 24.

With the substrate 26 formed of a photosensitive glass, or a photosensitive ceramic, a photochemical machining process can be used to form the recesses 40 for the contact members 28, and the vias for the internal conductors 32. Suitable photosensitive glass and glass-ceramic materials are manufactured by Corning under the trademarks "FOTO-FORM" and "FOTOCERAM". Briefly, the photochemical machining process can include forming masks as required, exposing the substrate to a source of radiation, heating the substrate to develop the exposed areas, and developing clear areas of the substrate by exposure to UV. The patterned substrate 26 can then be etched as required and a sintering step performed. The internal conductors 32 can then be formed as required by filling the vias, such as with an electroless deposition process. The contact members 28 and terminal contacts 30 can be formed as previously described.

With the substrate comprising an FR-4 material (e.g., glass filled circuit board material) a molding process can be used to form recesses 40 for the contact members 28 and the vias for the internal conductors 32. One suitable process is referred to as a 3-D molding process. This process uses injection molding and electroless plating to form a unitary structure with required metal features.

Referring to FIG. 3A, an alternate embodiment contact member 28A includes a conductive layer 42A comprising a flat pad formed on a substrate 26A. The conductive layer 42A can be formed of a metal that is non-reactive with contact bumps 12, 12A, 12B, 12W formed of solder as previously described. In addition, a plating or metallization process as previously described can be used to form the conductive layer 42A. The conductive layer 42A can be formed in electrical communication with internal conductors 32A within the substrate 26A substantially as previously described. In this embodiment the terminal contacts 30A comprise ball contacts arranged in a ball grid array. The terminal contacts 30A can be formed using the same process as outlined above for external contacts 30 (FIG. 3), but with a solder paste screen printed onto the flat land pads, heated and then reflowed into a ball. The terminal contacts 30A can also be formed of a hard metal as described in U.S. Pat. No. 5,783,461, filed Oct. 3, 1996, entitled "TEMPORARY SEMICONDUCTOR PACKAGE HAVING HARD-METAL, DENSE-ARRAY BALL CONTACTS AND METHOD OF FABRICATION", incorporated herein by reference.

Referring to FIG. 3B, an alternate embodiment contact member 28B includes a conductive layer 42B with a stepped recess 40B. The conductive layer 42B can be deposited on a substrate 26B as previously described. The stepped recess 40B can be formed in the conductive layer 42B using a wet or dry etch process and one or more etch masks. The stepped recess 40B provides multiple peripheral edges for penetrating the bumps 12, 12A, 12B, 12W. In addition, the stepped recess 40B allows excess material of bumps 12, 12A, 12B, 12W to flow downward without requiring excessive contact force. This allows the bumps to be minimally deformed. In addition, the conductive layer 42B can be formed substantially as previously described in electrical communication with an internal conductor 32B. In this embodiment the terminal contact 30B comprises a pin formed in a pin grid array. The terminal contacts 30B can be formed using the same process as outlined above for terminal contacts 30 (FIG. 3), but with a pin brazed or soldered to the flat land pads.

Referring to FIG. 3C, an alternate embodiment contact member 28C includes a conductive layer 42C formed in a recess and a coplanar terminal contact 30C. In this embodiment the terminal contact 30C comprises an exposed portion of the internal conductor 32C. A window 46 can be formed in the substrate 26C to allow access to the terminal contact 30C for contacting the terminal contact 30C using a non-bonded electrical connector (e.g., slide contact). Alternately, a bonded connection can be formed by wire bonding to the terminal contact 30C.

Referring to FIG. 3D, an alternate embodiment contact member 28D includes a conductive layer 42D with a recess 40D for retaining and electrically contacting the contact bumps 12, 12A, 12B, 12W. In addition, the conductive layer 42D can be formed in electrical communication with an internal conductor 32D and terminal contact 30D substantially as previously described. In this embodiment a compliant layer 48 is formed in a pit 50 in the substrate 26D. The pit 50 can be filled with an elastomeric material such as a silicone elastomer to form the compliant layer 48. One suitable elastomeric material for forming the compliant layer 48 comprises a silicone adhesive manufactured by Zymet. The compliant layer 48 located subjacent to the conductive layer 42D permits the conductive layer 42D to move vertically (i.e., up and down) during use (e.g., testing of a semiconductor bumped semiconductor component). This helps to cushion contact forces transmitted between the contact member 28D and contact bumps 12, 12A, 12B, 12W.

Figure 7A:
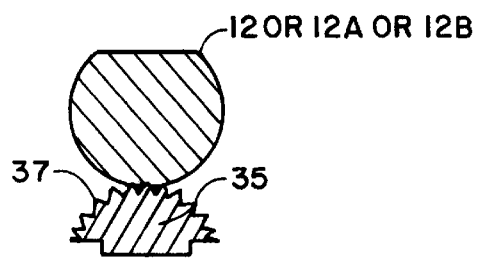
FIG. 7A is a schematic cross sectional view illustrating the contact member of FIG. 3E in electrical contact with a contact bump on a bumped semiconductor component.
Figure 7B:
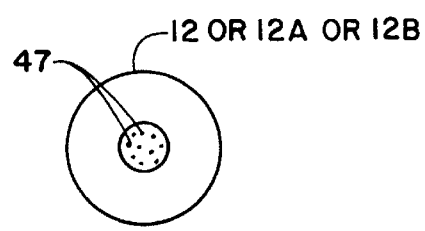
FIG. 7B is a schematic bottom view of the contact bump in FIG. 7A following contact with the contact member of FIG. 3E.

Referring to FIG. 3E, an alternate embodiment contact member 28E includes a microbump 35 having a rough textured surface 37. The rough textured surface 37 includes dendrites adapted to penetrate native oxide layers covering the contact bumps 12, 12A, 12B, 12W. The microbump 35 can be formed in an opening of a polymer film 39 in electrical communication with a conductor 33E. In addition, the microbump 35 can be formed of a material that is non-reactive with the contact bumps 12, 12A, 12B, 12W as previously described. A single microbump 35 can be adapted to contact a single contact bump 12, 12A, 12B, 12W. Alternately two or more microbumps 35 can be formed in groups, or spaced arrays, adapted to retain and contact a single contact bump 12, 12A, 12B, 12W. The microbump 35, film 39 and conductor 33E can comprise a multi layered tape such as "ASMAT" manufactured by Nitto Denko. The tape can be mounted to a substrate 26E using a compliant adhesive layer 41 formed of silicone, epoxy or other elastomer. Suitable methods for forming the microbump 35 with a rough textured surface 37 are disclosed in U.S. Pat. No. 5,487,999, entitled "METHOD FOR FABRICATING A PENETRATION LIMITED CONTACT STRUCTURE HAVING A ROUGH TEXTURED SURFACE", incorporated herein by reference. FIG. 7A illustrates a microbump 35 in electrical contact with a contact bump 12, 12A, 12B, 12W. As shown in FIG. 7B, following contact the bumps 12, 12A, 12B, 12W include perforations 47 caused by the textured surface 37.

Referring to FIG. 3F, an alternate embodiment contact member 28F includes a projection 43 formed integrally with a substrate 26F formed of silicon or other etchable material. One method for forming the projection 43 is by etching a silicon substrate 26F as described in U.S. Pat. No. 5,483,741, entitled "METHOD FOR FABRICATING A SELF LIMITING SILICON BASED INTERCONNECT FOR TESTING BARE SEMICONDUCTOR DICE", incorporated herein by reference. The projection 43 can be covered with a conductive layer 42F formed of a non-reactive metal using a suitable deposition or metallization process as previously described. The conductive layer 42F is in electrical communication with a conductor 33F formed on the substrate 26F. An electrically insulating layer (not shown) can be formed on the substrate 26F to electrically insulate the conductive layer 42F and conductor 33F from the bulk of the substrate 26F.

Figure 8A:
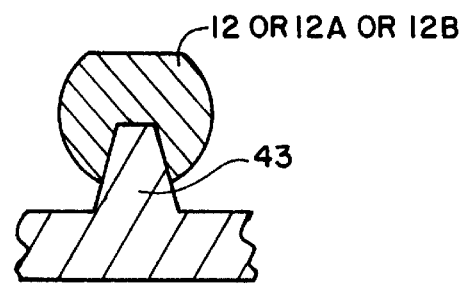
FIG. 8A is a schematic cross sectional view illustrating the contact member of FIG. 3F in electrical contact with a contact bump on a bumped semiconductor component.
Figure 8B:
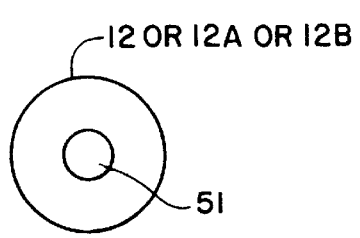
FIG. 8B is a schematic bottom view of the contact bump in FIG. 8A following contact with the contact member of FIG. 3F.

As shown in FIG. 8A, the projections 43 can be dimensioned and located to contact single contact bumps 12, 12A, 12B, 12W As shown in FIG. 8B, the projections 43 can be located on the interconnect to penetrate a center portion of the contact bumps 12, 12A, 12B, 12W leaving a void 51 approximately equal to the size of a projection 43. For some applications the contact bumps 12, 12A, 12B, 12W can be reflowed following a test procedure to remove the voids 51. Alternately, for some applications the projections 43 can be dimensioned such that the resultant voids 51 will not affect the operability of the contact bumps 12, 12A, 12B, 12W.

Figure 9A:
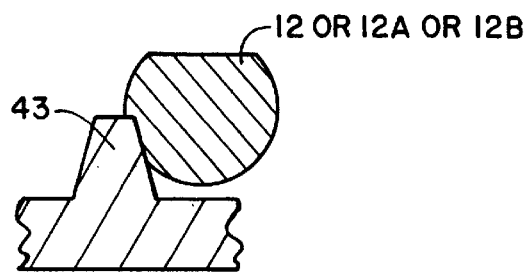
FIG. 9A is a schematic cross sectional view illustrating the contact member of FIG. 3F in electrical contact with a contact bump on a bumped semiconductor component.
Figure 9B:
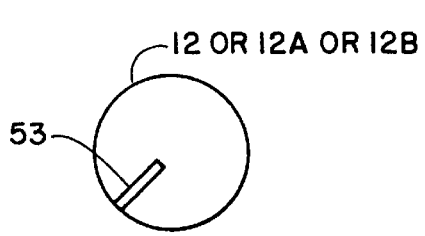
FIG. 9B is a schematic bottom view of the contact bump in FIG. 9A following contact with the contact member of FIG. 3F.

As another alternative shown in FIG. 9A and 9B, the projections 43 can be located on the interconnect to contact a surface of the contact bumps 12, 12A, 12B, 12W forming a groove 53 (FIG. 9B). In this case only a portion of the projections 43, such as edges thereof, will electrically contact and penetrate the contact bumps 12, 12A, 12B, 12W.

Figure 10A:
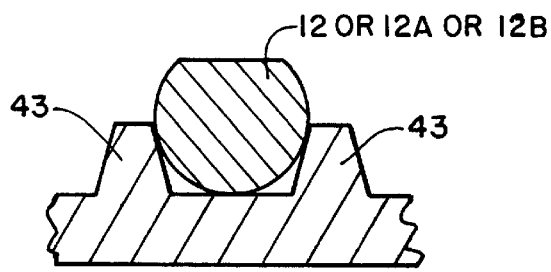
FIG. 10A is a schematic cross sectional view illustrating the contact member of FIG. 3F in electrical contact with a contact bump on a bumped semiconductor component.
Figure 10B:
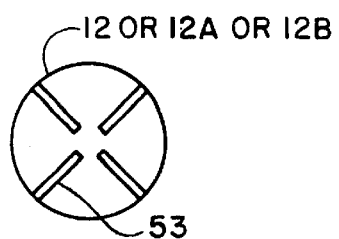
FIG. 10B is a schematic bottom view of the contact bump of FIG. 10A following contact with the contact member of FIG. 3F.

Alternately, as shown in FIGS. 10A and 10B two or more projections 43 can be formed in spaced arrays, adapted to retain and contact a single contact bump 12, 12A, 12B, 12W. In this case multiple grooves 53 can be formed in the contact bumps 12, 12A, 12B, 12W.

Wafer Level System

Referring to FIG. 4, a wafer level system 52W suitable for testing a semiconductor wafer 38 having contact bumps 12W is illustrated. The wafer level test system 52W includes an interconnect 24W constructed in accordance with the invention as previously described, and mounted to a testing apparatus 54.

The testing apparatus 54 includes, or is in electrical communication with testing circuitry 56. The testing apparatus 54 can be a conventional wafer probe handler, or probe tester, modified for use with the interconnect 24W. Wafer probe handlers and associated test equipment are commercially available from Electroglass, Advantest, Teradyne, Megatest, Hewlett-Packard and others. In this system 52W, the interconnect 24W takes the place of a conventional probe card.

The interconnect 24W includes contact members 28W configured to establish electrical communication with the bumps 12W on the wafer 38. The contact members 28W can be formed as previously described for contact members 28 (FIG. 3), 28A (FIG. 3A), 28B (FIG. 3B), 28C (FIG. 3C), 28D (FIG. 3D), 28E (FIG. 3E) or 28F (FIG. 3F). The contact members 28W on the interconnect 24W can be formed in patterns that match the patterns of the bumps 12W on the wafer 38.

The testing apparatus 54 also includes a wafer chuck 58 configured to support and move the wafer 38 in x, y and z directions as required. In particular the wafer chuck 58 can be used to step the wafer 38 so that the dice on the wafer 38 can be tested in groups until all of the dice have been tested. Alternately, the interconnect 24W can be configured to contact all of the bumps 12W for all of the dice on the wafer 38 at the same time. Test signals can then be selectively applied and electronically switched as required, to selected dice on the wafer 38.

As also shown in FIGS. 4, the interconnect 24W can mount to a probe card fixture 60 of the testing apparatus 54. The probe card fixture 60 can be similar in construction to a conventional probe card fixture commercially available from manufacturers such as Packard Hughes Interconnect and Wentworth Laboratories. The probe card fixture 60 can be formed of an electrically insulating material such as FR-4 or ceramic. In addition, the testing apparatus 54 can include a force applying mechanism in the form of multiple spring loaded electrical connectors 62 associated with the probe card fixture 60. The spring loaded electrical connectors 62 are in electrical communication with the testing circuitry 56.

The spring loaded electrical connectors 62 can be formed in a variety of configurations. One suitable configuration is known as a "POGO PIN" connector. This type of electrical connector includes a spring loaded pin adapted to contact and press against a flat surface to form an electrical connection. Pogo pin connectors are manufactured by Pogo Instruments, Inc., Kansas City, Kans. The spring loaded electrical connectors 62 can also comprise wires, pins or cables formed as spring segments or other resilient members.

In this embodiment the spring loaded electrical connectors 62 electrically contact the terminal contacts 30W formed on the interconnect 24W. The terminal contacts 30W can comprise land pads formed in a land grid array substantially as previously described for contacts 30 (FIG. 3). This configuration provides separate electrical paths from the testing circuitry 56, through the spring loaded electrical connectors 62, through the terminal contacts 30W, through the internal conductors 32W and through the contact members 28W to the contact bumps 12W. During a test procedure, test signals can be applied to the integrated circuits on the wafer 38 using these separate electrical paths.

In addition to establishing electrical communication with the interconnect 24W, the spring loaded electrical connectors 62 also provide a mechanical force necessary for biasing the interconnect 24W against the wafer 38. As shown in FIG. 4B, a contact force (F) biases the contact members 28W on the interconnect 24W against the contact bumps 12W on the wafer 38. The contact force (F) insures a reliable electrical connection between the contact members 28W and contact bumps 12W. The contact force (F) can be selected as required by adjusting the spring constants for the spring loaded electrical connectors 62.

Further details of a wafer level system similar to the system 52W are contained in U.S. patent application Ser. No. 08/797,719, filed Feb. 10, 1997, entitled "PROBE CARD FOR SEMICONDUCTOR WAFERS AND METHOD AND SYSTEM FOR TESTING WAFERS" which is incorporated herein by reference.

Referring to FIG. 4A, an alternate embodiment wafer level system 52WA includes a testing apparatus 54 comprising a probe card fixture 60, testing circuitry 56 and spring loaded electrical connectors 62 as previously described. In this embodiment a wafer level interconnect 24WA includes contact members 28C and terminal contacts 30C formed as previously described. The interconnect 24WA is mounted to a mounting plate 64 associated with the probe card fixture 60. The mounting plate 64 includes contact pads 72 that electrically contact the spring loaded electrical connectors 62. In addition, the mounting plate 64 includes internal conductors 32MP and bonding pads 70. The mounting plate can be an insulating material such as ceramic, FR-4 or photosensitive glass formed substantially as previously described for interconnect 24. The bonding pads 70 on the mounting plate 64 can be bonded to the terminal contacts 30C on the interconnect 24WA using bondwires 66.

The system 52WA also includes a compressible member 68 located between the mounting plate 64 and the interconnect 24WA. The compressible member 68 can be formed of an elastomeric material, or as a gas or liquid filled bladder. The compressible member 68 functions to cushion the forces applied by the interconnect 24WA to the wafer 38 (FIG. 4).

Die Level Test System

Figure 5A:
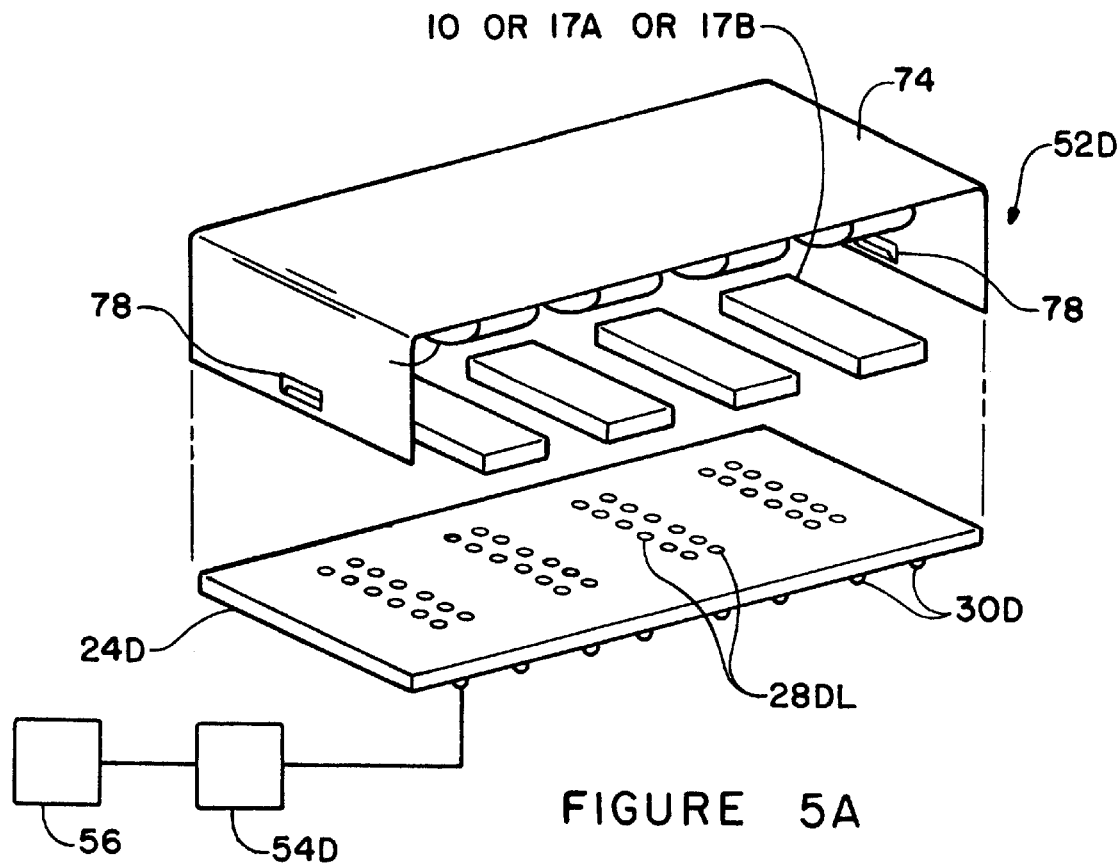
FIGS. 5A and 5B are schematic perspective views illustrating a system for testing semiconductor dice or packages using an interconnect constructed in accordance with the invention.
Figure 5B:
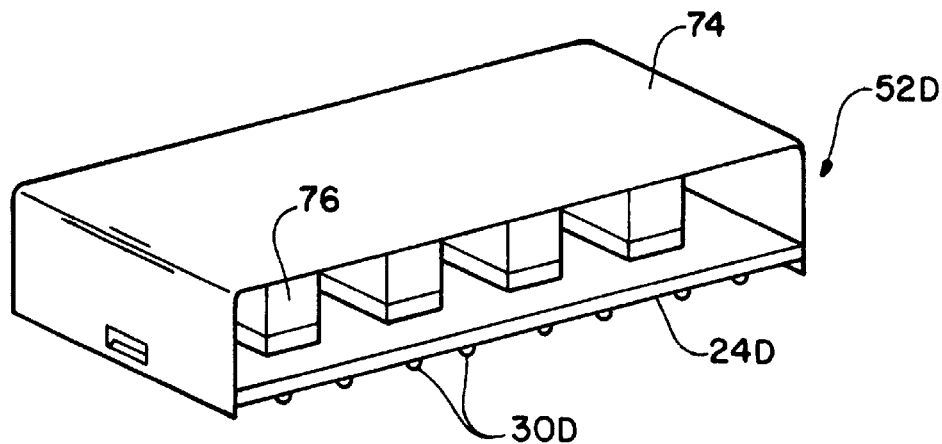

Referring to FIGS. 5A and 5B, a die level system 52D for testing singulated semiconductor dice 10 or packages 17A, 17B in accordance with the invention is shown. The die level test system 52D includes an interconnect 24D, a force applying mechanism 74, and a testing apparatus 54D in electrical communication with testing circuitry 56.

The interconnect 30D is configured to mount one or more dice 10, or chip scale package 17A or 17B, in electrical communication with the testing apparatus 54D and testing circuitry 56. The interconnect 24D is formed substantially as previously described for interconnect 24 (FIG. 2). The interconnect 24D includes patterns of contact members 28DL configured to retain and make electrical connections with the contact bumps 12, 12A or 12B, on the dice 10 or packages 17A or 17B.

In the die level system 52D, the testing apparatus 54D can be a test socket on a burn-in board, or similar apparatus used for testing conventional plastic or ceramic semiconductor packages. In addition, the testing apparatus 54D can include electrical connectors (not shown) configured to electrically contact the terminal contacts 30D on the interconnect 24D. The electrical connectors can comprise clips, slides, wire bonds or similar electrical members. The electrical connectors form separate electrical paths between the testing circuitry 56 and the contact members 28DL.

The force applying mechanism 74 can be shaped as a bridge clamp, and can include clip members 78 that attach to the interconnect 24D. Openings or slots (not shown) can be provided on the interconnect 24D for mating engagement with the clip members 78. In addition, the force applying mechanism 74 includes spring members 76 configured to bias the dice 10, or chip scale packages 17A, 17B, against the interconnect 24D. The spring members 76 can comprise curved metal springs, resilient elastomeric members, or gas or liquid filled bladders.

For assembling the dice 10, or packages 17A or 17B, on the interconnect 24D, optical alignment techniques can be used to optically align the bumps 12, 12A, 12B with the contact members 28DL. A suitable method of optical alignment is disclosed in U.S. Pat. No. 5,519,332, entitled "CARRIER FOR TESTING AN UNPACKAGED SEMICONDUCTOR DIE", incorporated herein by reference. Alternately mechanical alignment using fences or other alignment members can be employed.

The contact members 28DL can be dimensioned to accommodate some misalignment of the bumps 12, 12A, 12B with respect to the contact members 22D. In addition, the contact members 28DL can provide an alignment function by allowing the bumps 12, 12A, 12B to self center within the contact members 28D. The contact members 28DL can also accommodate z-direction variations in the bumps 12, 12A, 12B (i.e., planarity of the bumps). Still further, the bumps 12, 12A, 12B can be planarized by contact with the contact members 28DL.

The terminal contacts 30D on the interconnect 24D are in electrical communication with the contact members 28DL. The terminal contacts 30D can comprise ball, pins, or pads arranged in a dense grid array (e.g., BGA). The terminal contacts 30D establish electrical communication with the testing apparatus 54D.

Testing Method

Referring again to FIG. 4, a representative test sequence for the wafer level system 52W is as follows. Initially the testing apparatus 54 can be provided. The interconnect 24W can be mounted to the testing apparatus 54. The testing apparatus 54 can then be operated to bias the interconnect 24W and wafer 38 together. In addition, a compressible member 68 (FIG. 4A) can be used to cushion the forces applied by the testing apparatus 54 to the interconnect 24W and to allow the contact members 28W to self planarize to the bumps 12W on the wafer 38. Test signals can then be applied by the testing circuitry 56 to the integrated circuits and semiconductor devices on the wafer 38.

With interconnect 24W configured to contact all of the dice on the wafer 38 at the same time, the test signals can be electronically switched, as required, to selected dice. With interconnect 24W configured to contact a portion of the dice on the wafer 38, stepping techniques can be used to step the interconnect 24W, or the wafer 38, such that the dice are tested in sequence. In addition, the mounting of the interconnect 24W to the probe card fixture 60, permits different interconnects to be easily interchanged for testing different types of wafers.

Referring again to FIGS. 5A and 5B, a representative test sequence for the die level system 52D is as follows. Initially the interconnect 24D, force applying mechanism 74 and testing apparatus 54D can be provided. For assembling the dice 10 or packages 17A, 17B, the bumps 12, 12A, 12B can be aligned with the contact members 28DL on the interconnect 24D. This can be accomplished using an optical alignment apparatus as described in the previously cited U.S. Pat. No. 5,519,332 or by mechanical alignment as previously described. The aligned dice 10, or packages 17A, 17B, and interconnect 24D can then be placed in contact and the force applying mechanism 74 attached to the interconnect 24D.

The assembly can then be placed within the testing apparatus 54D. Mounted within the testing apparatus 54D, test signals can be applied by the testing circuitry 56 to the integrated circuits and semiconductor devices on the dice 10 or packages 17A, 17B.

Thus the invention provides an improved interconnect for testing semiconductor dice, packages or wafers having contact bumps. The interconnect is designed to provide a reliable electrical connection to the contact bumps within a specified size range, and with a minimal application of contact force. Still further, the contact members aid in centering the contact bumps to the interconnect and help to planarize a height of the contact bumps.

While the invention has been described with reference to certain preferred embodiments, as will be apparent to those skilled in the art, certain changes and modifications can be made without departing from the scope of the invention as defined by the following claims.

What is claimed is:

1. A system for testing a semiconductor component comprising:
   a testing apparatus comprising an electrical connector in electrical communication with testing circuitry;
   an interconnect on the testing apparatus comprising:
      a substrate;
      a compliant layer on the substrate;
      a contact member on the substrate comprising a conductive layer on the compliant layer, and a recess in the conductive layer configured to retain a contact bump on the component, the conductive layer having a peripheral edge configured to penetrate a surface of the contact bump to form a peripheral groove therein; and
      a contact on the substrate in electrical communication with the conductive layer and configured for electrical communication with the electrical connector.

2. The system of claim 1 wherein the compliant layer comprises an elastomeric material deposited in a pit in the substrate.

3. The system of claim 1 wherein the system comprises a temporary package for the component.

4. The system of claim 1 wherein the testing apparatus comprises a wafer probe handler.

5. A system for testing a semiconductor component comprising:
   a testing apparatus comprising a plurality of electrical connectors in electrical communication with testing circuitry;
   an interconnect mounted to the testing apparatus comprising a plurality of contact members formed on a surface thereof, each contact member comprising a stepped recess configured to retain and electrically engage a contact bump on the component, the recess comprising a conductive layer with a first peripheral edge proximate to the surface configured to penetrate and electrically contact the contact bump to form a first peripheral groove therein, and a second peripheral edge within the recess configured to penetrate and electrically contact the contact bump to form a second peripheral groove therein; and
   a plurality of contacts on the interconnect in electrical communication with the contact members and configured for electrical communication with the electrical connectors.

6. The system of claim 5 wherein the component comprises a wafer and the testing apparatus comprises a wafer handler.

7. The system of claim 5 wherein the component comprises a bare die or a chip scale package and the system comprises a temporary package.

8. The system of claim 5 further comprising a compressible member on the interconnect for cushioning a contact force applied by the testing apparatus.

9. The system of claim 5 wherein the recess is configured to allow the contact bums to deform into the recess.

10. The system of claim 5 wherein a diameter of the first peripheral edge is selected to electrically contact a first contact bump having a first diameter or a second contact bump having a second diameter.

11. The system of claim 5 wherein the contact members are configured to electrically engage a plurality of contact bumps on the component in a ball grid array.

12. A system for testing a semiconductor component comprising:
   a testing apparatus comprising a plurality of electrical connectors in electrical communication with testing circuitry;
   an interconnect on the testing apparatus comprising a plurality of spaced arrays of contact members configured to electrically engage a plurality of contact bumps formed in a grid array on the component, each spaced array comprising a plurality of projections configured to retain a contact bump on the component in a space therebetween, each projection at least partially covered with a conductive layer having an edge configured to penetrate and electrically contact the contact bump and to form an elongated groove in a surface thereof;
   a plurality of contacts on the interconnect in electrical communication with the contact members and with the electrical connectors.

13. The system of claim 12 wherein each contact member comprises at least two projections.

14. The system of claim 11 wherein the component comprises a wafer and the testing apparatus comprises a wafer probe handler.

15. The system of claim 11 wherein the component comprises a chip scale package and the system comprises a temporary package for housing the chip scale package.

16. A system for testing a semiconductor component comprising:
   a testing apparatus comprising an electrical connector in electrical communication with testing circuitry;
   an interconnect on the testing apparatus configured to establish electrical communication between the testing circuitry and the component;
   the interconnect comprising:
      a substrate;
      a compliant layer on the substrate;
      a contact member comprising a conductive layer on the compliant layer and a recess in the conductive layer having a peripheral edge configured to penetrate a contact bump on the component, with a diameter of the edge and a depth of the recess selected to electrically engage a first contact bump having a minimum average diameter, or a second contact bump having a maximum average diameter; and
   a contact on the interconnect in electrical communication with the conductive layer and with the electrical connector.

17. The system of claim 16 wherein the recess comprises a stepped member having a first peripheral edge proximate a surface of the substrate and a second peripheral edge within the recess.

18. The system of claim 16 wherein the substrate comprises a pit and the compliant layer comprises an elastomeric material deposited in the pit.

19. The system of claim 16 wherein the component comprises a chip scale package and the system comprises a temporary package for the chip scale package.

20. A system for testing a semiconductor component comprising:
   a testing apparatus comprising an electrical connector in electrical communication with testing circuitry;
   an interconnect on the testing apparatus configured to establish electrical communication between the testing circuitry and the component;
   the interconnect comprising:
      a substrate;
      an elastomeric compliant layer on the substrate;

a contact member on the substrate configured to electrically contact a contact bump on the component, the contact member comprising a conductive layer on the compliant layer and a recess in the conductive layer configured to retain the contact bump, the recess and conductive layer forming a peripheral edge configured to penetrate a surface of the contact bump to form a groove therein; and a contact on the substrate in electrical communication with the conductive layer and configured for electrical communication with the electrical connector.

21. The system of claim 20 wherein the elastomeric material comprises silicone deposited in a pit on the substrate.

22. The system of claim 20 the recess comprises a stepped member having at least two peripheral edges.

23. The system of claim 20 wherein the component comprises a plurality of contact bumps in a ball grid array and the interconnect comprises a plurality of contact members.

24. The system of claim 20 wherein the component comprise a bare die or a chip scale package.

* * * * *